United States Patent

Hilliard

(10) Patent No.: US 11,432,417 B2
(45) Date of Patent: Aug. 30, 2022

(54) ASSEMBLY LATCH RELEASE

(71) Applicant: Lenovo (Singapore) Pte. Ltd., Singapore (SG)

(72) Inventor: Matthew Sean Hilliard, Raleigh, NC (US)

(73) Assignee: Lenovo (Singapore) Pte. Ltd., Singapore (SG)

(*) Notice: Subject to any disclaimer, the term of this patent is extended or adjusted under 35 U.S.C. 154(b) by 0 days.

(21) Appl. No.: 17/137,886

(22) Filed: Dec. 30, 2020

(65) Prior Publication Data
US 2022/0210936 A1    Jun. 30, 2022

(51) Int. Cl.
| *H05K 7/20* | (2006.01) |
| *H05K 5/02* | (2006.01) |
| *E05B 65/00* | (2006.01) |
| *E05B 5/00* | (2006.01) |
| *G06F 1/18* | (2006.01) |
| *E05B 13/00* | (2006.01) |
| *E05C 9/04* | (2006.01) |

(52) U.S. Cl.
CPC ........... *H05K 5/0221* (2013.01); *E05B 5/006* (2013.01); *E05B 13/002* (2013.01); *E05B 65/006* (2013.01); *G06F 1/181* (2013.01); *E05C 9/047* (2013.01); *E05Y 2900/606* (2013.01)

(58) Field of Classification Search
CPC .. H05K 5/0004; H05K 5/0204; H05K 5/0208; H05K 5/0221; G06F 1/181
See application file for complete search history.

(56) References Cited

U.S. PATENT DOCUMENTS

| 6,834,919 B1 * | 12/2004 | Mariano | G06F 1/181 312/223.2 |
| 2003/0080567 A1 * | 5/2003 | Peacock | G06F 1/181 292/3 |
| 2017/0112008 A1 * | 4/2017 | Zhu | H05K 7/1488 |
| 2017/0235346 A1 * | 8/2017 | Burghart | G06F 1/183 312/223.2 |
| 2020/0329570 A1 * | 10/2020 | Monroe | H05K 5/0221 |

\* cited by examiner

*Primary Examiner* — Anthony Q Edwards
(74) *Attorney, Agent, or Firm* — Brian J. Pangrle

(57) ABSTRACT

An assembly can include a chassis that includes a chamber and an opening; a cover movable for access to the chamber via the opening; a cover latch; and a cover latch release that includes a push panel operatively coupled via a linkage to a pull panel that includes a finger grip surface, where the linkage rotates the pull panel responsive to rotation of the push panel to expose the finger grip surface, and where further rotation of the pull panel releases the cover latch.

20 Claims, 8 Drawing Sheets

ASSEMBLY LATCH RELEASE

TECHNICAL FIELD

Subject matter disclosed herein generally relates to computing assemblies.

BACKGROUND

A computing assembly can include a chassis that houses circuitry and a cover where the cover is removable for access to the circuitry.

SUMMARY

An assembly can include a chassis that includes a chamber and an opening; a cover movable for access to the chamber via the opening; a cover latch; and a cover latch release that includes a push panel operatively coupled via a linkage to a pull panel that includes a finger grip surface, where the linkage rotates the pull panel responsive to rotation of the push panel to expose the finger grip surface, and where further rotation of the pull panel releases the cover latch. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
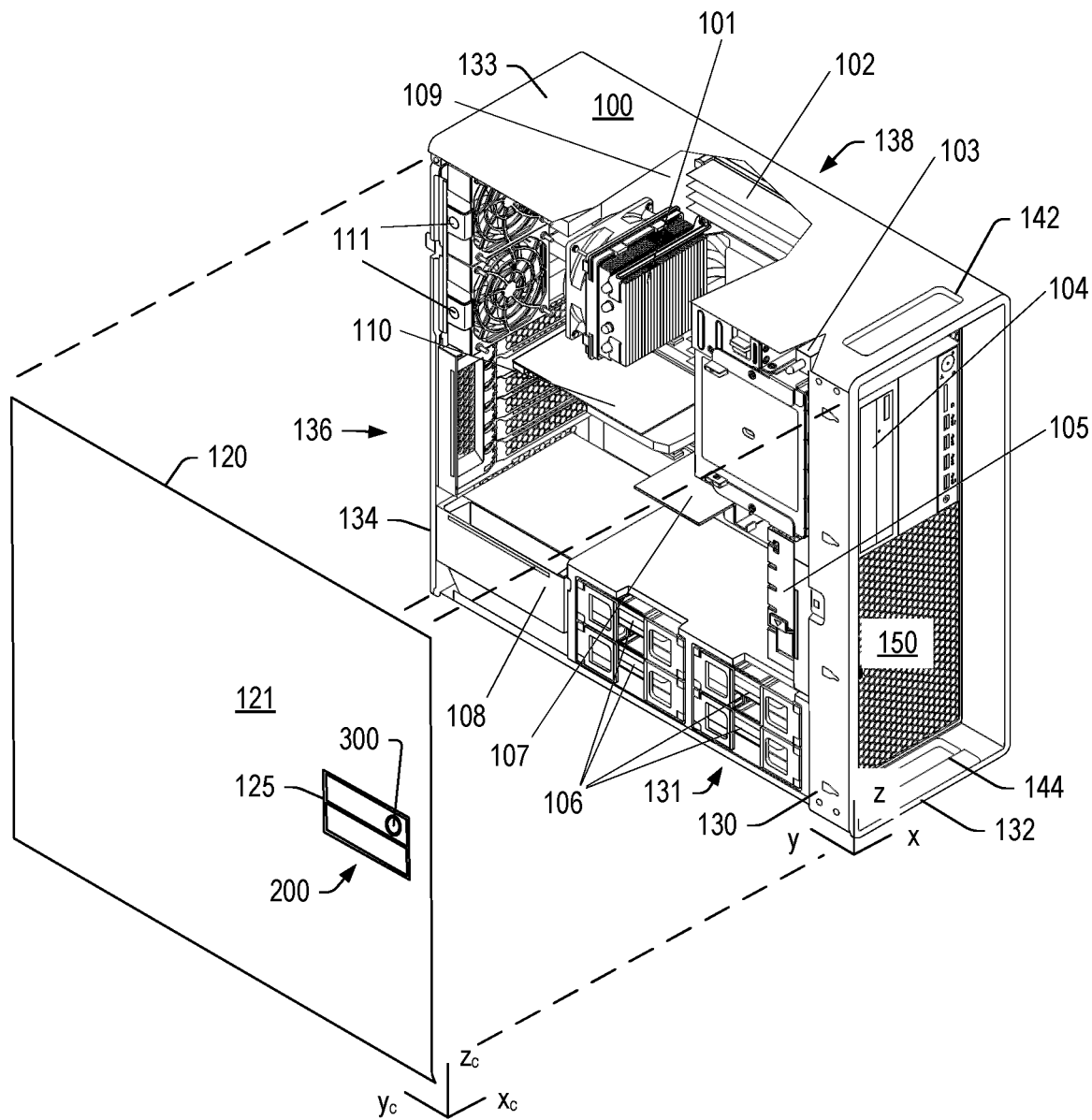
FIG. 1 is a perspective view of an example of a computing assembly.

FIG. 1 shows an example of a computing assembly 100 that includes a cover 120 with a latch release 200, which may be referred to as a cover latch release. As shown, the cover 120 includes an opening 125 where the latch release 200 is exposed via the opening 125. As shown, the cover 120 can include cover surface 121 where the opening 125 is in the cover surface 121 and where at least a portion of the latch release 200 may be exposed substantially flush to the cover surface 121. In such an example, the computing assembly 100 may be movable into and/or out of a space with minimal risk of a portion of the latch release 200 being caught on an object. For example, the computing assembly 100 may be located on a desk, under a desk, in a cabinet, on a shelf, etc., where it is desirable to have an ability to translate the computing assembly 100 inwardly and outwardly (e.g., for servicing, upgrading, attachment of one or more cables, etc.).

As shown in the example of FIG. 1, the computing assembly 100 includes heat sink and fan assemblies 101, memory components 102, a cover presence switch 103 (e.g., an intrusion switch), an optical drive 104, a front fan assembly 105, hard drives 106, a flex adapter 107, a power supply 108, a system board 109 (e.g., a motherboard, etc.), PCI card slots and one or more PCI cards 110, one or more rear fan assemblies 111. In the example of FIG. 1, the system board 109 can include one or more processors that can access memory such as, for example, memory of the memory components 102. In the example of FIG. 1, one or more processors may be disposed at least in part in one or more of the heat sink and fan assemblies 101. For example, a heat sink can be a processor heat sink that helps to transfer heat energy generated during operation of a processor away from the processor.

In the example of FIG. 1, the computing assembly 100 includes a chassis 130 that includes a bottom side 131, a front side 132, a top side 133, a back side 134 and open side 136 and an opposing side 138. As shown, the cover 120 can cover the open side 136. The cover 120 can be latched to the chassis 130 and removable from the chassis 130 via the latch release 200. As shown, the latch release 200 can include a lock 300, which may be a key lock that includes a keyway that can receive a key where tumblers can be displaced by the key in a manner that allows for rotation of the key. In such an example, rotation of the key in the lock 300 can transition the latch release 200 from a locked state to an unlocked state, or vice versa. As indicated, the computing assembly 100 can include the cover presence switch 103, which may be actuated upon removal of the cover 120 and/or upon actuation of the latch release 200. As one or more components of the computing assembly 100 may be utilized to store and/or process sensitive information, one or more mechanisms may help to protect such one or more components from unauthorized access and/or tampering.

In the example of FIG. 1, the chassis 130 is shown as including a top handle 142, a bottom handle 144 and a front panel 150, which can include openings for air flow. For example, one or more fans of the fan assemblies 101, 105 and 111 of the computing assembly 100 may be powered using power provided via the power supply 108 to move air through the chassis 130, which may help to remove heat generated during operation of the computing assembly 100 (e.g., operation of one or more processors of the system board 109, memory, etc.).

As an example, the computing assembly 100 may include one or more temperature sensors. For example, consider one or more temperature sensors operatively coupled to thermal regulation circuitry, which may be operatively coupled to one or more of the fans of the fan assemblies 101, 105 and 111. As an example, a latch release such as the latch release 200 may include one or more indicators that are operatively coupled to thermal regulation circuitry and/or other circuitry. For example, consider a status indicator that may indicate thermal and/or other status of one or more components of the computing assembly 100.

As an example, a latch release such as, for example, the latch release 200 may be operatively coupled to circuitry, electronically and/or mechanically. As an example, a latch release may be operable in a manner that causes a disconnect of one or more circuits to one or more components (e.g., power supply, memory, drive, etc.). As an example, a latch release may be operable in a manner that causes a computing assembly to enter a particular state of a plurality of operational states where the particular state may be a "safe" state for purposes of accessing one or more components housed within a chassis.

In the example of FIG. 1, the computing assembly 100 may be defined with respect to one or more coordinate systems. For example, two Cartesian coordinate systems are illustrated, one for the chassis 130 (x, y and z) and another for the cover 120 ($x_c$, $y_c$ and $z_c$). As shown, the open side 136 of the chassis 130 can be defined as being planar such as in the y,z-plane while the cover 120 can be defined as being planar such as in the $y_c$,$z_c$-plane. As an example, the cover 120 can be of an area that is sufficient to cover the open side 136 or at least one or more openings of an open side. As mentioned, the computing assembly 100 may be positioned for translatable movement, such as, for example, in a direction along the y axis. As an example, the computing assembly 100 may be positioned for rotational movement such as, for example, to rotate the open side 136 upwards such that the cover 120 is upwards for access and/or removal (e.g., via the latch release 200, etc.).

As an example, a cover may be on one side, more than one side, etc. For example, consider an L-shaped or a U-shaped cover. As an example, a latch release may be oriented on a cover in one or more manners, for example, near an edge of the cover, central on the cover, etc. As an example, a latch release may be located on a chassis where the latch release is operable to provide for release of a cover or covers. For example, consider one latch release that can release multiple covers. As an example, a latch release may be on a cover where actuation of the latch release may release multiple covers (e.g., or provide for release of another cover). As an example, a cover may be part of a mechanism that can, once removed, provide for access to a portion of another cover (e.g., consider an overlapping mechanism).

Figure 2A:
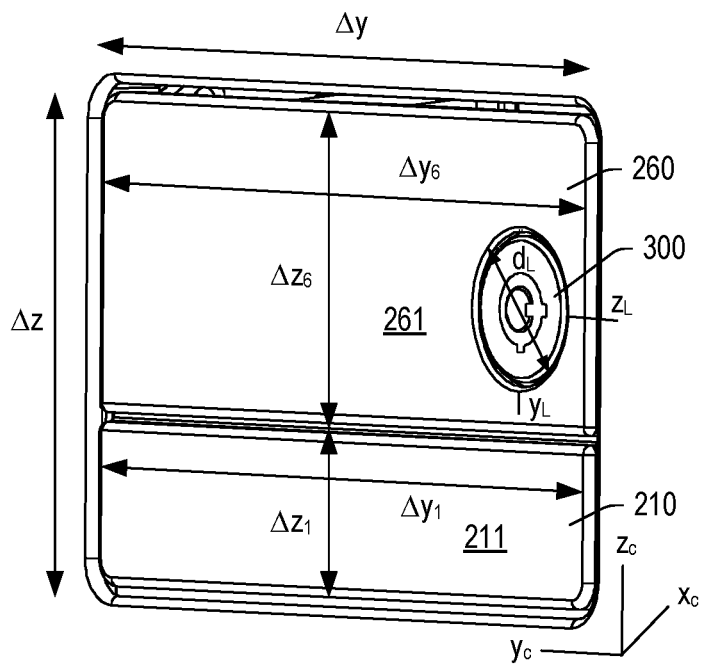
FIG. 2A and FIG. 2B are views of an example of latch release.
Figure 2B:
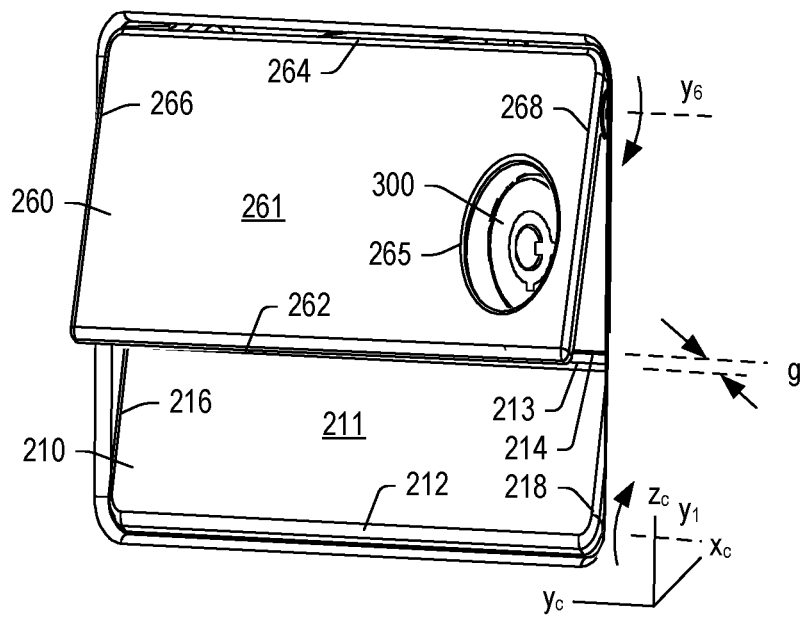

FIG. 2A and FIG. 2B show perspective views of the latch release 200 as including a push panel 210 and a pull panel 260. In FIG. 2A, the push panel 210 and the pull panel 260 can be substantially flush to a surface of a cover. For example, the push panel 210 can include a planar surface 211 and the pull panel 260 can include a planar surface 261 where the planar surfaces 211 and 261 may be substantially within a common plane where the surface 121 of the cover 120 can also be substantially within that common plane.

As an example, the planar surfaces 211 and 261 may be even with the surface 121 of the cover 120 or slightly recessed therefrom (e.g., within 8 mm or less). In such an approach, the panels 210 and 260 may have a reduced risk of catching on an object if the computing assembly 100 is moved.

As shown in FIG. 2B, actuation of the push panel 210 can cause movement of the pull panel 260. Movement of the pull panel 260 can be sufficient to create a gap such that a portion of a human hand can contact the pull panel 260 for purposes of further movement, which can cause release of a latch such as a cover latch. In the example of FIGS. 2A and 2B, actuation of the push panel 210 can synchronously cause movement of the pull panel 260 such that the pull panel 260 is in a position for contact by a portion of a human hand (e.g., one or more fingertips, etc.). For example, actuation of the push panel 210 can synchronously move the pull panel 260 to make a portion of the pull panel 260 accessible via a gap that can be defined between the push panel 210 and the pull panel 260.

As shown in FIG. 2A and FIG. 2B, the push panel 210 can be defined via various dimensions including a width $\Delta y_1$ between opposing side edges 216 and 218 and a height $\Delta z_1$ between a swing out edge 212 and a swing in edge 214 and the pull panel 260 can be defined via various dimensions including a width $\Delta y_6$ between opposing side edges 266 and 268 and a height $\Delta z_6$ between a swing out edge 262 and a swing in edge 264. As shown in FIG. 2B, the push panel 210 can rotate about an axis $y_1$ and the pull panel 260 can rotate about an axis $y_6$. As shown, such rotations can generate a gap g between the swing in edge 214 of the push panel 210 and the swing out edge 262 of the pull panel 260. In such an approach, the gap g is generated by movement of the two edges, the swing out edge 262 and the swing in edge 214.

As an example, the gap g may be of a distance that is sufficient for insertion of at least one fingertip. For example, consider a fingertip of the index finger, which may be articulated via a joint of the distal phalanx. As an example, the gap g may be at least approximately 0.5 cm and may be, for example, in a range of approximately 0.5 cm to 2.5 cm or, for example, larger than 2.5 cm. As an example, the dimension $\Delta y_1$ may be at least approximately 2 cm and the dimension $\Delta z_1$ may be at least approximately 2 cm. As an example, the dimension $\Delta y_6$ may be at least approximately 2 cm and the dimension $\Delta z_6$ may be at least approximately 2 cm. In the example of FIG. 2A and FIG. 2B, the dimension $\Delta z_6$ is greater than the dimension $\Delta z_1$.

As shown in the example of FIG. 2B, the push panel 210 can include a contoured surface 213 that may be referred to as a recessed contact surface. Such a surface may be utilized to locate the pull panel 260 such that the pull panel 260 is substantially flush with the push panel 210. As an example, the contoured surface 213 may be utilized to form an "internal" contact with the pull panel 260 such that intrusion between by an implement (e.g., a finger, a tool, etc.) is hindered. For example, such contact may hinder access to the lock 300, if present. As explained, the lock 300 may include one or more features that secure one or both of the panels 210 and 260 of the latch release 200. In such an example, the push panel 210 may be immovable such that the swing in edge 214 cannot be pushed inwardly to cause movement outwardly of the swing out edge 262 of the pull panel 260.

In the example of FIGS. 2A and 2B, the latch release 200 includes the lock 300 where the pull panel 260 includes an opening 265 where a face of the lock 300 that includes a keyway is exposed via the opening 265. As an example, a lock may be with or without a keyway. For example, consider a magnetic and/or electronic lock that may be actuated without use of a physical key being inserted into a keyway. As an example, a lock may be operatively coupled to circuitry where the lock can be locked or unlocked via the circuitry using one or more instructions, commands, etc. (e.g., consider a wired and/or a wireless lock).

Figure 3A:
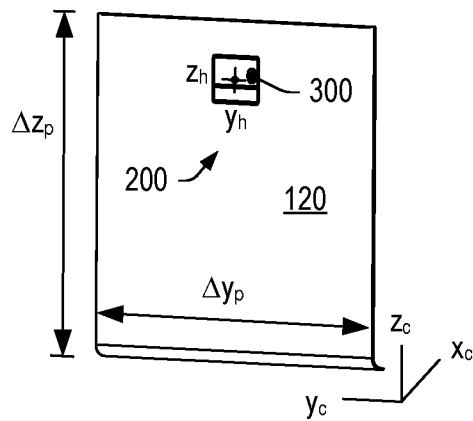
FIG. 3A and FIG. 3B are views of an example of a latch release or portions thereof.
Figure 3B:
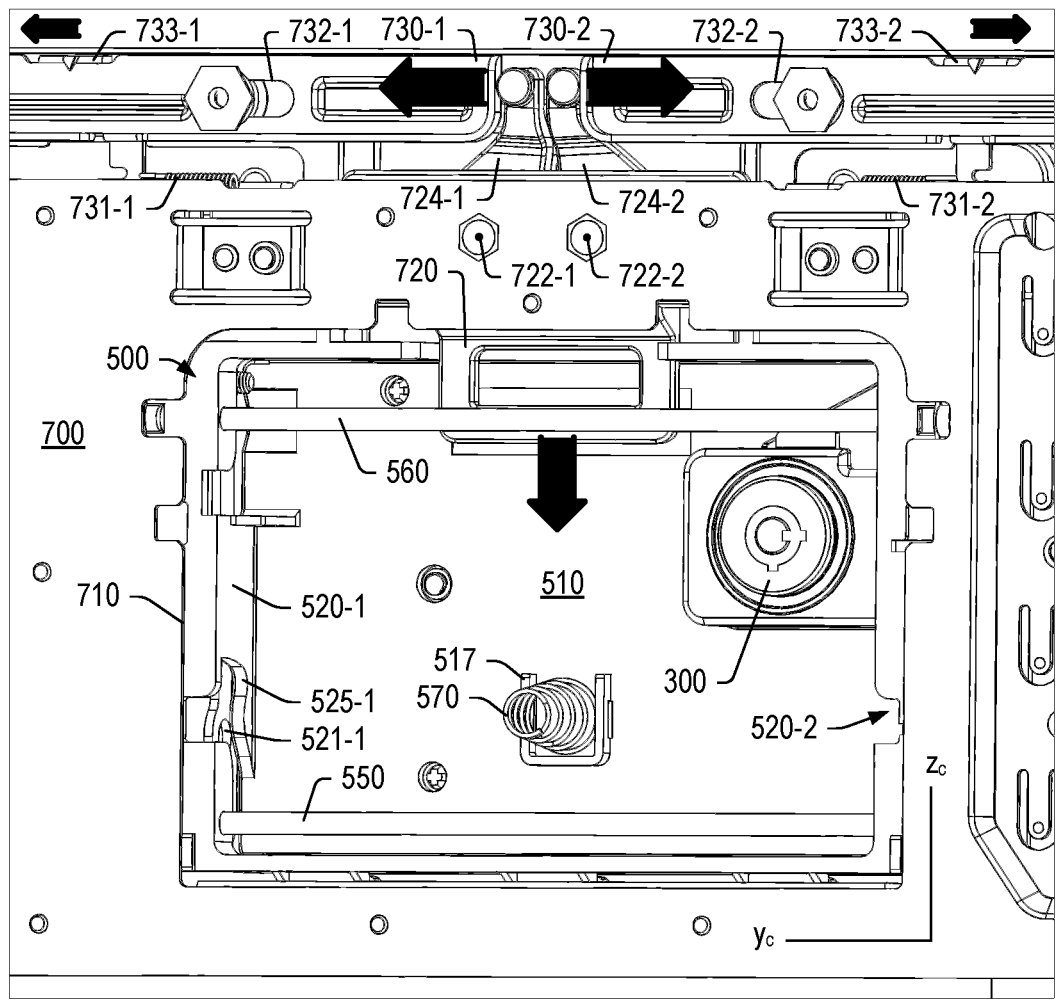

FIG. 3A and FIG. 3B show an example of the latch release 200 with respect to the cover 120 with an example orientation that differs from that of the example of FIG. 1. As shown, the cover 120 may be defined using various dimensions such as, for example, $\Delta y_p$ and $\Delta z_p$. As an example, the latch release 200 may be defined at least in part by a centroid defined using coordinates $y_h$ and $z_h$.

FIG. 3B shows the cover 120 without the cover surface 121, which may be a cover skin (e.g., a metal, polymeric, etc., sheet that forms an outer surface of the cover 120). As shown, the latch release 200 can include a latch release case 500 that is operatively coupled to a cover frame 700. As shown in FIG. 3B, the cover frame 700 can include various components, features, etc., for latching of the cover 120 to a chassis such as, for example, the chassis 130 of the computing assembly 100 of FIG. 1.

As shown, the cover frame 700 can include an opening 710, a keeper 720, pivots 722-1, 722-2, movers 724-1 and 724-2, latches 730-1 and 730-2, springs 731-1 and 731-2, guides 732-1 and 732-2, and hooks 733-1 and 733-2.

As shown, the latch release case 500 can include a back plate 510 that includes a spring locator 517 for locating a spring 570, side walls 520-1 and 520-2 and axles 550 and 560. In the example of FIG. 3B, the push panel 210 and the pull panel 260 can be operatively coupled to the axles 550 and 560, respectively, which can define the rotational axes $y_1$ and $y_6$ as shown in FIG. 2B. As an example, the push panel 210 can be disposed in the latch release case 500 using the side walls 520-1 and 520-2 where, as shown in FIG. 2B, the side wall 520-1 includes various features 521-1 and 525-1 for guiding movements of the push panel 210. While not shown in FIG. 2B, the side wall 520-2 can include various features corresponding to the features 521-1 and 525-1 (e.g., mirrored image feature, etc.).

In the example of FIG. 3B, various arrows are shown to indicate approximate directions of movement during latch release. For example, the pull panel 260 can include a tongue receivable by an opening in the keeper 720 where the tongue can contact the keeper 720 to move it downwardly (e.g., toward the axle 550). In response, the movers 724-1 and 724-2 can rotate about the pivots 722-1 and 722-2 to push against the latches 730-1 and 730-2 and move the latches 730-1 and 730-2 by overcoming forces of the springs 731-1 and 731-2 where the latches 730-1 and 730-2 translate via the guides 732-1 and 732-2 such that the hooks 733-1 and 733-2 translate in outwardly in opposing directions. In such an example, a chassis can include openings that receive the hooks 733-1 and 733-2 (e.g., chassis keepers) where movement of the hooks 733-1 and 733-2 responsive to actuation of the latch release 200 unlatches the cover frame 700 from the chassis. To install the cover 120, the pull panel 260 may be held outwardly to control positioning of the hooks 733-1 and 733-2 to fit into openings (e.g., chassis keepers) of a chassis where upon release of the pull panel 260, the springs 731-1 and 731-2 can pull the latches 730-1 and 730-2 inwardly such that the hooks 733-1 and 733-2 engage the chassis to secure the cover 120 to the chassis.

Figure 4:
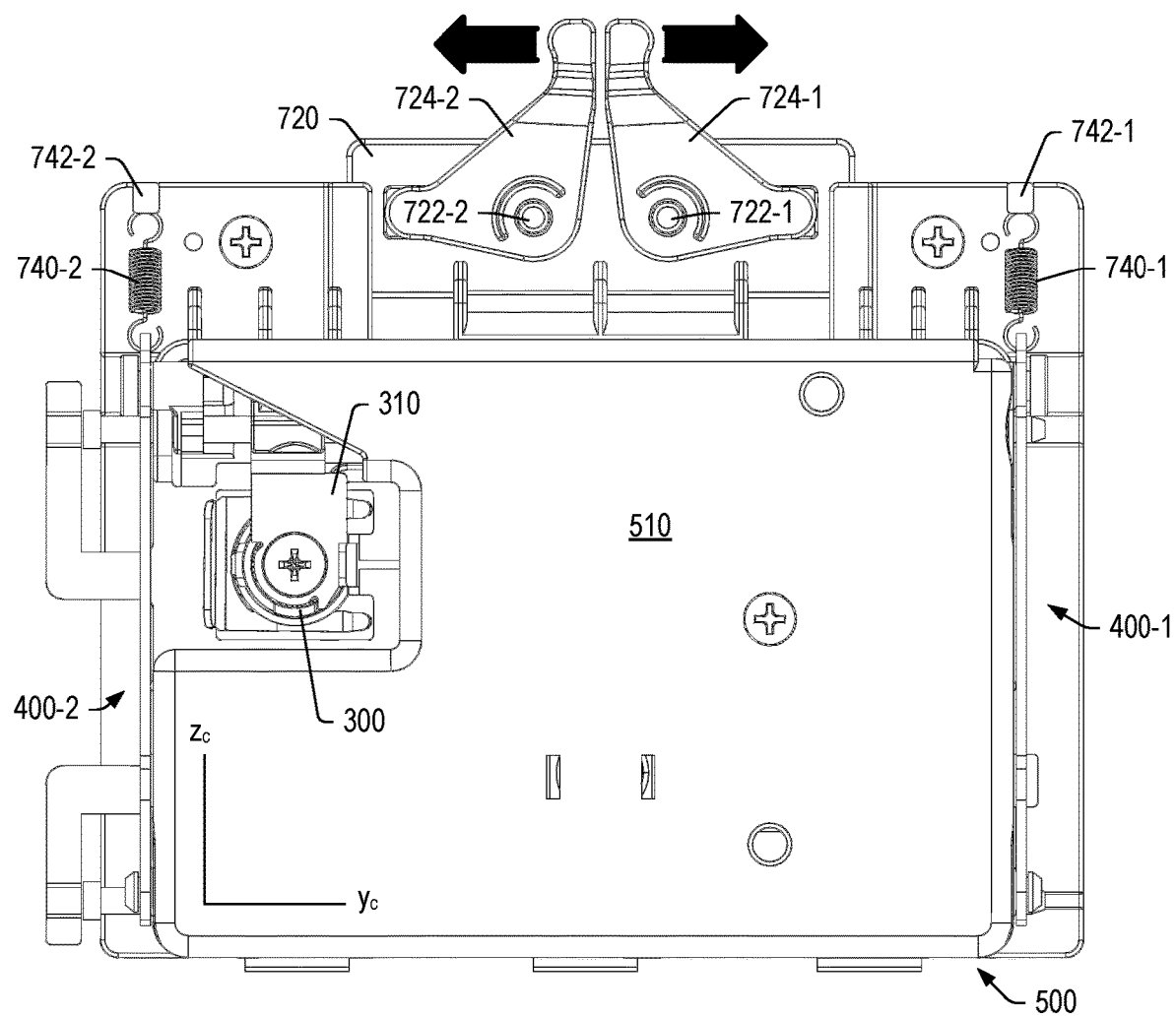
FIG. 4 is a view of an example of an assembly.

FIG. 4 shows a back side view of the case 500 and various other features such as, for example, the pivots 722-1 and 722-2, the movers 724-1 and 724-2, the lock 300, a lock latch 310, linkages 400-1 and 400-2 and springs 740-1 and 740-2 where the spring 740-1 is coupled to the linkage 400-1 and a coupling 742-1 and where the spring 740-2 is coupled to the linkage 400-2 and a coupling 742-2. As shown, the springs 740-1 and 740-2 act to bias the linkages 400-1 and 400-2 upwardly in FIG. 4 in a direction along the $z_c$-axis.

As an example, the linkages 400-1 and 400-2 can move downwardly in FIG. 4 responsive to pushing of the push panel 210, which may be biased by at least the spring 570 such that force is required to push the push panel 210. As an example, multiple spring forces may exist that apply a bias or biases synchronously, asynchronously, etc. For example, the springs 740-1 and 740-2 may act in unison with the spring 570 while the springs 740-1 and 740-2 may act separately when the pull panel 260 is rotated beyond a kickout position dictated by actuation of the push panel 210.

As an example, a user may apply a pushing force to the push panel 210 using a back side or back sides of one or more the user's fingers such that the one or more fingers may be slipped into the gap g, as created responsive to application of such pushing force. As an example, the surface 211 of the push panel 210 may be coated, machined, treated, etc., to be resistance to scratching from fingernails, whether unpainted, painted, artificially extended, etc. As an example, the push panel 210 and/or the pull panel 260 can be shaped, machines, treated, coated, etc., to minimize damage to one or more fingers and/or fingernails.

Figure 5:
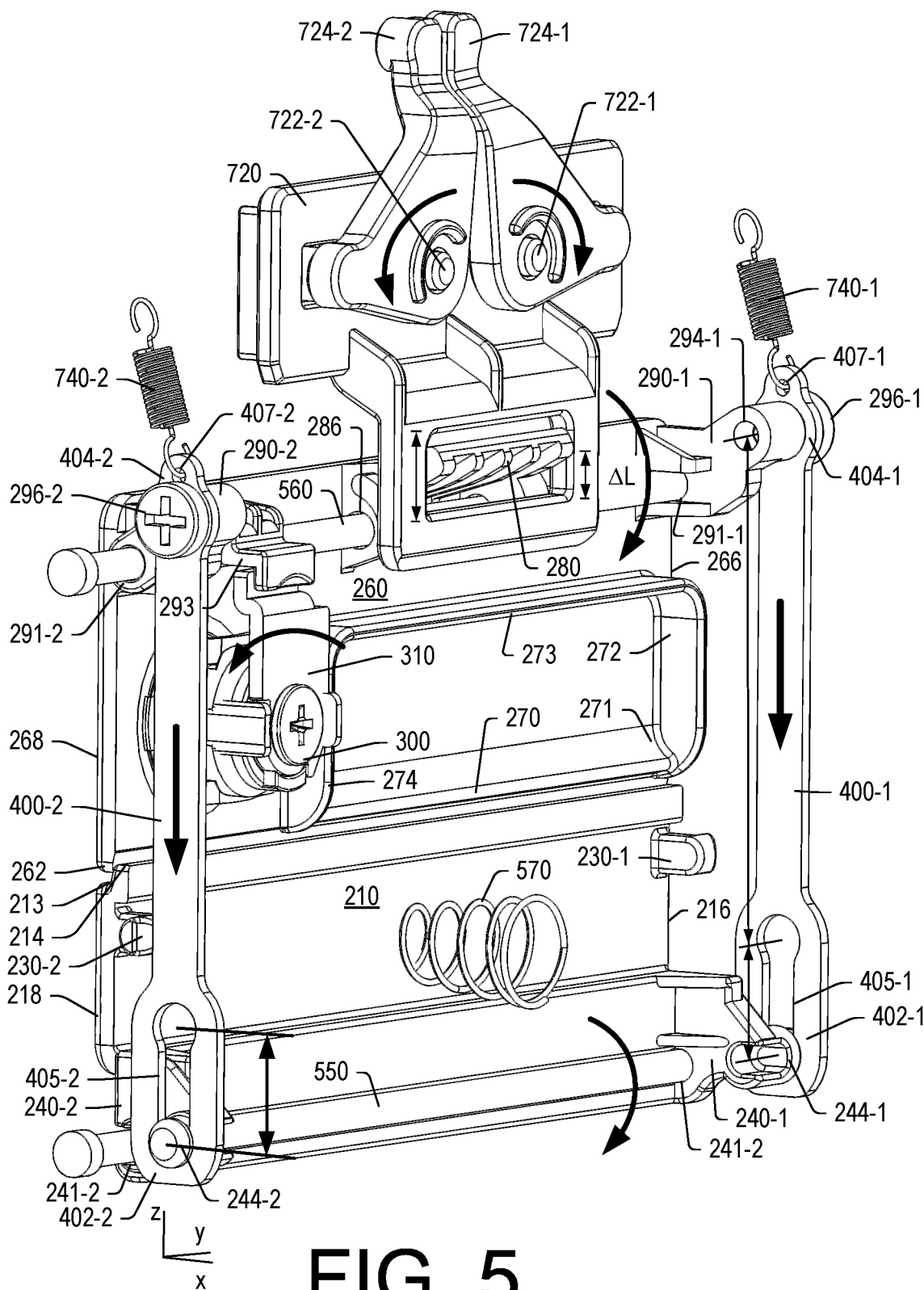
FIG. 5 is a perspective view of an example of a latch release.

FIG. 5 shows a perspective view of various components, including various latch release components of the latch release 200. FIG. 5 also shows various arrows that correspond to motions that can occur during actuation of the latch release 200.

In the example of FIG. 5, the push panel 210 includes stops 230-1 and 230-2 and extensions 240-1 and 240-2 that include axles 244-1 and 244-2 (e.g., or bores for axles, etc.) and the pull panel 260 includes a finger grip surface 270 within a grip frame that includes side walls 272 and 274 that join an upper wall 273 where a contoured surface 271 extends from the finger grip surface 270. As explained, a user may place a fingernail side of a finger against the surface 211 of the push panel 210 to push the push panel 210 to cause movement of the pull panel 260 where a surface such as the finger grip surface 270 may be exposed, which can be on a finger pad side of the finger. In the example of FIG. 5, the shape of the finger grip surface 270 and the contoured surface 271 may be contacted by one or more finger pads of one or more fingers. For example, consider articulation of a finger at the distal phalanx such that the finger curves to increase contact between a finger pad and the contoured surface 271, which may facilitate pulling on the pull panel 260. In the example of FIG. 5, the extensions 240-1 and 240-2 can be or include push panel lever arms.

As shown in the example of FIG. 5, the side walls 272 and 274 and/or the upper wall 273 can help to locate one or more fingers, which may help to avoid a finger contacting a component that may damage a finger and/or the component. For example, the side walls 272 and 274 and the upper wall 273 can form a pocket for one or more fingers.

As shown in FIG. 5, the pull panel 260 can include extensions 290-1 and 290-2 that can include bores and/or axles; noting that a bore 294-1 is shown with respect to the extension 290-1. In the example of FIG. 5, the extensions 290-1 and 290-2 can be or include pull panel lever arms.

In the example of FIG. 5, the linkages 400-1 and 400-2 include various features. For example, consider ends 402-1, 402-2, 404-1 and 404-2, where the ends 402-1 and 402-2 include elongated openings 405-1 and 405-2, respectively, which may be referred to as slots. As shown, the elongated openings 405-1 and 405-2 can include features to receive respective axles 244-1 and 244-2. For example, the elongated openings 405-1 and 405-2 can be of a greater dimension at an upper end such that the axles 244-1 and 244-2 can be received during assembly (e.g., to operatively coupled the linkages 400-1 and 400-2 to the push panel 210. As shown, the linkages 400-1 and 400-2 can include openings at the ends 404-1 and 404-2, respectively, where axles 296-1 and 296-2 can be received in the openings where the axles 296-1 and 296-2 are received by corresponding bores of the extensions 290-1 and 290-2 (see, e.g., the bore 294-1 of the extension 290-1 where the extension 290-2 can include a corresponding bore). In the example of FIG. 5, the axles 296-1 and 296-2 may be screws or bolts. During assembly, the linkages 400-1 and 400-2 may be coupled to the extensions 240-1 and 240-2 of the push panel 210 and then aligned such that the axles 296-1 and 296-2 can be fit into bores of the extensions 290-1 and 290-2 of the pull panel 260.

As explained, a latch release can be spring-biased. In the example of FIG. 5, the linkages 400-1 and 400-2 include couplings 407-1 and 407-2 that can be used to couple to the springs 740-1 and 740-2, respectively; noting that the example of FIG. 5 also shows the spring 570, which can bias the push panel 210.

As an example, one or more features may provide for alignment of the push panel 210 and/or the pull panel 260 in the orientation shown in FIG. 5. For example, the springs 740-1 and 740-2 may act in part to inwardly forcibly bias an overhanging portion of the pull panel 260 at or proximate to the edge 262 against the contoured surface 213 of the push panel 210 and act in part via the linkages 400-1 and 400-2 to outwardly forcibly bias the edge 214 of the push panel 210. In such an example, depending on lever arms, axles, friction, etc., there may be some offsetting of forces. In the example of FIG. 5, as explained, the push panel 210 can be outwardly forcibly biased via at least the spring 570 where the one or more stops 230-1 and 230-2 may be L-shaped such that a stop surface can contact a rim portion of an assembly where the rim may define an opening for the push panel 210. In such an example, the one or more stops 230-1 and 230-2 can under a biasing force of the spring 570 be in contact with the rim portion such that the surface 211 of the push panel 210 is substantially flush with an outer surface of a cover (see, e.g., the cover 120 of FIG. 3A). As an example, the force of the spring 570 applied to the push panel 210 and the one or more stops 230-1 and 230-2 can provide for substantially flush alignment of the surfaces 211 and 261. As shown in the example of FIG. 5, the spring 570 can be larger in size (e.g., larger diameter wire, larger diameter coil, etc.) than the springs 740-1 and 740-2. Where a user pushes against the surface 211 of the push panel 210, the force applied can cause the spring 570 to contract (shorten) and cause the springs 740-1 and 740-2 to extend (lengthen). In such an example, a push force of the latch release 200 can be defined at least in part by the spring constants of the springs 570, 740-1 and 740-2 (e.g., consider Hooke's law). In such an example, the push force may be tailored for ergonomics and, for example, to maintain contact between the axles 244-1 and 244-2 and the linkages 400-1 and 400-2 such that rotation of the push panel 210 responsive to applied force causes synchronous rotation of the pull panel 260. For example, if a gap existed, the push panel 210 would have to rotate by some amount to diminish the gap before engagement of the linkages 400-1 and 400-2 such that synchronous movement would not commence until the gap is overcome.

As shown in the example of FIG. 5, the push panel 210 can include bores 241-1 and 241-2 that receive the axle 550 and the pull panel 260 can include bores 291-1 and 291-2 that receive the axle 560. As explained, such axles can define rotational axes $y_1$ and $y_6$, respectively. FIG. 5 shows curved arrows to indicate directions of rotation of the push panel 210 and the pull panel 260. In the example view of FIG. 5, the directions of rotation are both clockwise where the swing in edge 214 swings inwardly while the swing out edge 262 swings outwardly to thereby expose the finger grip surface 270 and to create a gap (see, e.g., the gap g of FIG. 2B), which can accommodate at least a portion of a finger.

In the example of FIG. 5, the pull panel 260 includes a keeper 293 that can cooperate with the lock latch 310. As shown, the lock latch 310 may rotate to engage or disengage the keeper 293 (e.g., a pull panel keeper). With the lock latch 310 engaged with the keeper 293, rotation of the pull panel 260 is limited (e.g., restricted) such that a gap cannot be created for finger access to the finger grip surface 270. As the linkages 400-1 and 400-2 operatively coupled the push panel 210 and the pull panel 260, the lock latch 310 can limit movement of the push panel 210. For example, as the axles 244-1 and 244-2 can be seated at the bottom end of the elongated openings 405-1 and 405-2, respectively, where the extensions 290-1 and 290-2 are limited in movement (e.g., restriction to minimal movement (e.g., less than several degrees of rotation about the axle 560)), then the axles 244-1 and 244-2 cannot effectively move the linkages 405-1 and 405-2 downwardly. In such an example, the springs 740-1 and 740-2 do not stretch (e.g., consider Hooke's law where $F=-k\Delta x_s$ where $x_s$ is a spring axis dimension and k is a spring constant) because contact occurs between the lock latch 310 and the keeper 293 of the pull panel 260. Further, the spring 570 may not contract as the push panel 210 cannot be pushed inwardly (e.g., where the axles 244-1 and 244-2 are in contact with the linkages 400-1 and 400-2). As shown in the example of FIG. 5, the keeper 293 can engage the lock latch 310 such that the push panel 210 and the pull panel 260 remain substantially static when an inwardly, pushing force is applied to the push panel 210 as the engagement of the lock latch 310 and the keeper 293 can prohibit clockwise rotation of the pull panel 260 about the axle 560, which can thereby maintain the positions of the linkages 400-1 and 400-2.

As to travel of the pull panel 260 after travel responsive to movement of the push panel 210, consider lengths of the elongated openings 405-1 and 405-2 of the linkages 400-1 and 400-2. Such lengths can allow for the pull panel 260 to move without the pull panel 260 causing movement of the push panel 210. For example, the linkages 400-1 and 400-2 can move downwardly to an extent where the upper ends of the elongated openings 405-1 and 405-2 contact the axles 244-1 and 244-2 of the push panel 210. Such movement can be sufficient to cause a tongue 280 of the pull panel 260 to contact the keeper 720 to thereby cause the keeper 720 to move downwardly in the view of FIG. 5 and thereby cause rotation of the movers 724-1 and 724-2 about the pivots 722-1 and 722-2, which, as explained, can cause unlatching with respect to a chassis of a computing assembly. As shown in the example of FIG. 5, the tongue 280 can extend from the pull panel 260 where one or more bores 286 are provided that receive the axle 560, which may facilitate alignment of the tongue 280 about the axle 560 and strengthen the pull panel 260 such that risk of material deformation may be reduced. In such an example, the axle 560 may bear force where one of the one or more bores 286 contacts the axle 560 as the tongue 280 contacts the keeper 720 for application of force for unlatching.

In the example of FIG. 5, the keeper 720 is shown as including an opening that receives the tongue 280 of the pull panel 260. As shown, some amount of free travel can occur as indicated by a dimension $\Delta L$. For example, pushing of the push panel 210 can cause the tongue 280 to travel a free distance until it approaches and/or contacts a lower surface of the keeper 720. In such an example, the keeper 720 can remain stationary while the push panel 210 is pushed and then be moved upon further movement of the pull panel 260, for example, by application of force to the pull panel 260 via one or more fingers being in contact with the finger grip surface 270 (e.g., and the contoured surface 271, etc.).

As explained, the latch release 200 can include the finger grip surface 270, where a linkage rotates the pull panel 260 responsive to rotation of the push panel 210 to expose the finger grip surface 270, and where further rotation of the pull panel 260 releases a cover latch.

Further, the latch release 200 can return automatically to a state such as the state illustrated in FIG. 5, which can be a state where the surfaces 211 and 261 are substantially flush. As an example, such an automatic return may be driven at least in part by the spring 570 applying an outward biasing force against the push panel 210, which can cause the axles 244-1 and 244-2 to seat at the ends of the elongated openings 405-1 and 405-2 of the linkages 400-1 and 400-2 where the linkages 400-1 and 400-2 can be biased via the springs 740-1 and 740-2.

Figure 6A:
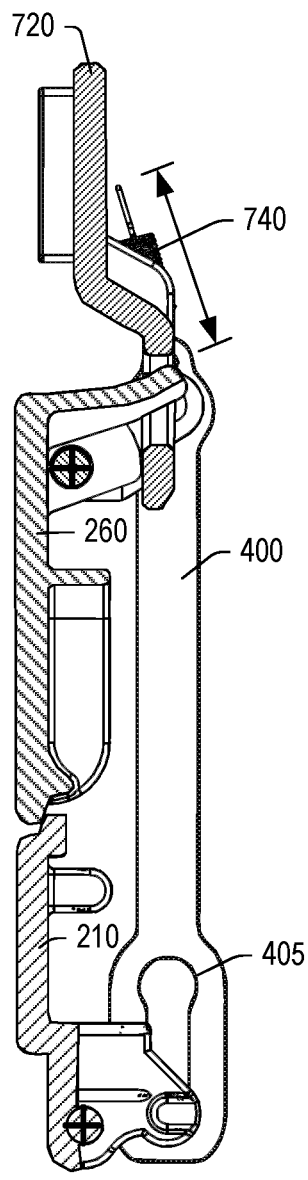
FIG. 6A, FIG. 6B and FIG. 6C are approximate cross-sectional views of an example of a latch release.
Figure 6B:
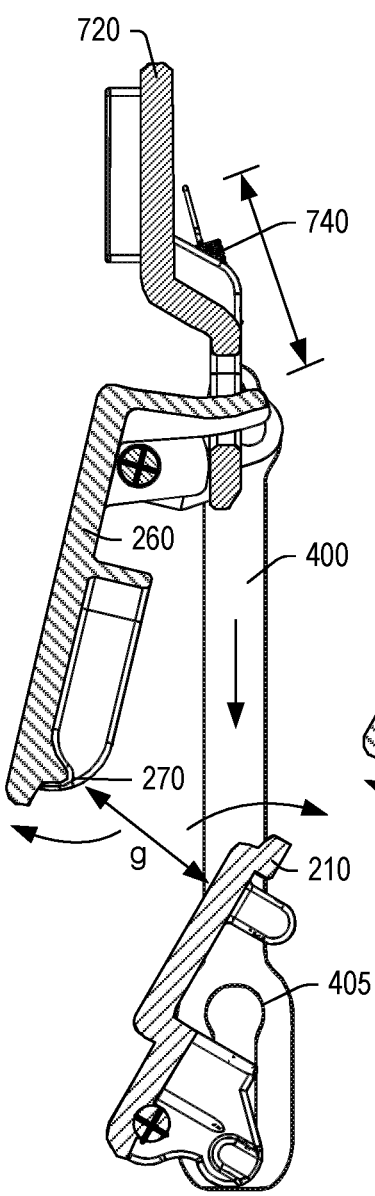
Figure 6C:
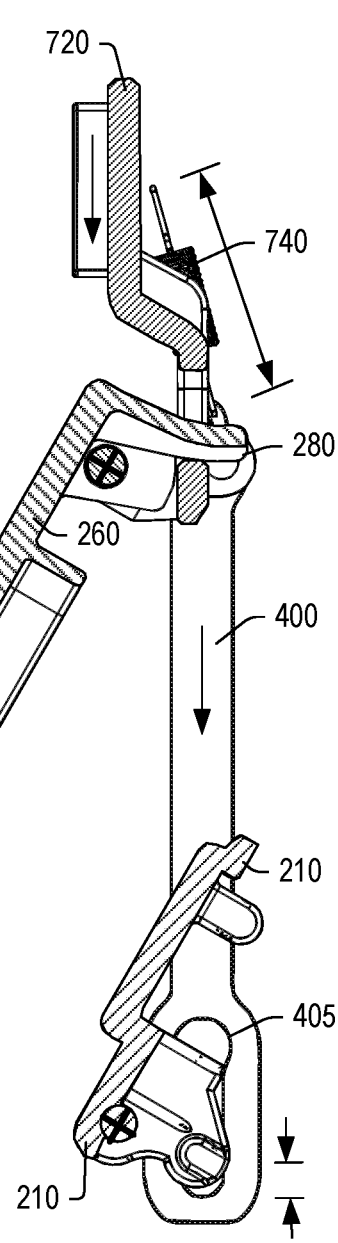

FIG. 6A, FIG. 6B and FIG. 6C show approximate cross-sectional views of the latch release 200 in various positions. FIG. 6A shows a stationary state where the push panel 210 and the pull panel 260 are aligned in a common plane. FIG. 6B shows rotation of the pull panel 260 responsive to rotation of the push panel 210 for creation of the gap g, which exposes the finger grip surface 270 for finger access (e.g., blind access if the pull panel is made of an opaque material, without see through openings, etc.). FIG. 6C shows rotation of the pull panel 260 in a manner sufficient to engage the tongue 280 and the keeper 720 to cause motion of the keeper 720, for example, to unlatch a latch.

As an example, a push panel and/or a pull panel may be integrally formed with various features. For example, consider forming a push panel with one or more integral extensions, which may be or include one or more lever arms and/or forming a pull panel with one or more integral extensions, which may be or include one or more lever arms. As explained, a linkage can operatively couple push panel lever arm and a pull panel lever arm. In such an example, the lengths of the lever arms may be of a selected length or lengths to provide for a ratio of motion of an edge of a pull panel with respect to an edge of a push panel, which, in combination, can create a gap. For example, dimensions of a push panel and dimensions of a pull panel along with lever arm lengths and/or linkage shape may determine how a gap is created responsive to movement of the push panel. As an example, an extension may form an angle with respect to a panel. For example, as shown in FIG. 5, FIG. 6A, FIG. 6B and FIG. 6C, the extensions 290-1 and 290-2 extend outwardly at approximately 90 degrees and then bend upwardly at approximately 45 degrees and the extensions 240-1 and 240-2 extend outwardly at approximately 90 degrees.

As shown in FIG. 6A, FIG. 6B and FIG. 6C, the linkage 400 can move downwardly responsive to movement of the push panel and then independent of the push panel responsive to further movement of the pull panel (e.g., that causes the keeper 720 to move downwardly). In such an example, the linkage 400 provides for synchronous motion of both panels and independent motion of the pull panel. In such an example, synchronous motion is driven by the push panel where, after some amount of synchronous motion, the pull panel can be moved independent of the push panel. For example, in FIG. 6C, the lower end of elongated opening 405 moves below the extension of the push panel 210. In such an example, the spring 570, if present, can apply a spring-bias to the push panel 210, which may cause the push panel 210 to move to or toward the state as shown in FIG. 6A. As a user may be pulling on the pull panel 260 for further rotation to engage the keeper 720, a gap can be sufficient to avoid pinching a user's finger or fingers between the panels 210 and 260.

Figure 7:
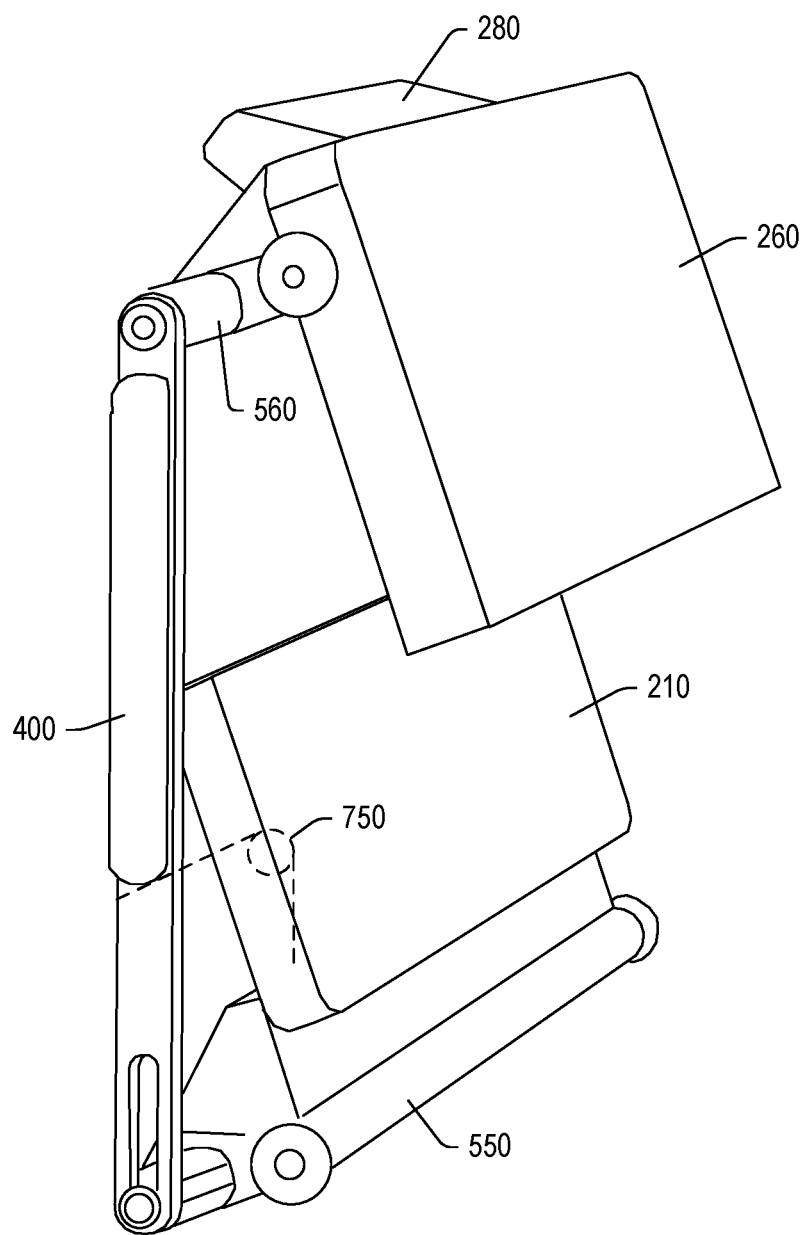
FIG. 7 is a perspective view of an example of a latch release.

FIG. 7 shows a perspective view of an example of the latch release that includes the push panel 210 and the pull panel 260 along with the tongue 280 where the linkage 400 can be spring-biased using a torsion spring 750, which may be set about a post of a case, a frame, etc. While the example of FIG. 7 shows the linkage 400 as a single linkage, the latch release may include multiple linkages.

As an example, a latch release can include one or more features that can increase and/or decrease action. For example, consider a cam that can cause a particular controlled motion of a pull panel responsive to movement of a push panel. In such an example, the amount of rotation of the pull panel can be proportional accord to a constant or not to rotation of the push panel. For example, a cam may cause a small initial movement followed by a larger movement (e.g., arc) to a set position where further rotation can be performed via a pulling force being applied to the pull panel. In such an example, a small amount of initial rotation of the pull panel may be such that the amount of movement is sufficient to indicate proper operation to a user without surprising a user. For example, a small rotation to the push panel that generates a very large rotation of the pull panel may be surprising to a user; whereas, a gentler development of the gap g may provide for a more pleasing user experience.

As an example, an area of a push panel can be less than an area of a pull panel. As an example, a latch release may be a plunge and pull latch release where the plunge causes movement of a pull panel that generates a gap for access to a finger grip surface.

Figure 8:
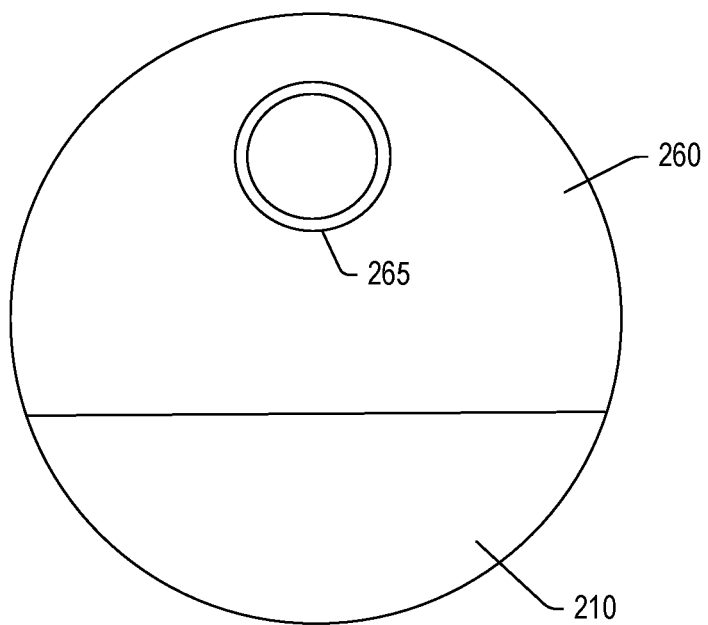
FIG. 8 is a perspective view of an example of a latch release.

FIG. 8 shows a plan view of an example of the latch release 200 that includes a curved perimeter. For example, the push panel 210 can be a portion of a circle and the pull panel 260 can be a portion of a circle where the portions may substantially form a full circle. As shown, the latch release 200 may optionally include the lock opening 265. In the example of FIG. 8, the latch release 200 may be defined via a diameter where the perimeter is circular or, for example, via a major axis and a minor axis where the perimeter is ellipsoidal, etc.

As explained, a latch release may be a flush synchronized computing assembly chassis side panel handle. As an example, a computing assembly can be a desktop computing assembly (e.g., a desktop computer, etc.) that can include a removable side panel (e.g., a cover) for service. As an example, a latch release can be of a depth that does not interfere with components in a chassis of a computing assembly. As an example, a latch release can be of a depth that provides for suitable workstation space design, for example, consider space design for a dual chamber chassis where the latch release provides a low profile handle design.

As an example, an assembly can include a chassis that includes a chamber and an opening; a cover movable for access to the chamber via the opening; a cover latch; and a cover latch release that includes a push panel operatively coupled via a linkage to a pull panel that includes a finger grip surface, where the linkage rotates the pull panel responsive to rotation of the push panel to expose the finger grip surface, and where further rotation of the pull panel releases the cover latch. In such an example, the chassis can include at least one processor and memory accessible to at least one of the at least one processor.

As an example, a linkage of an assembly can operatively couple a push panel lever arm and a pull panel lever arm. For example, a push panel can include a push panel lever arm and a pull panel can include a pull panel lever arm where the lever arms are operatively coupled to a linkage such that upon pushing of the push panel the pull panel swings out to expose a finger grip surface. In such an example, the push panel can include a surface suitable for pushing on using a fingernail side of a finger such that the finger grip surface is then exposed in response where contact can be made via a finger pad side of the finger. As an example, an assembly can include a push panel axle and a pull panel axle, where movement of a push panel lever arm rotates a push panel about the push panel axle and where movement of a pull panel lever arm rotates a pull panel about the pull panel axis. For example, a linkage can operatively couple the lever arms such that synchronous movement can occur of a push panel and a pull panel where further movement of the pull panel to unlatch a mechanism may occur without synchronous movement of the push panel.

As an example, a linkage can be or can include a bar and may be referred to as a bar linkage. As an example, a bar linkage can include an elongated opening. In such an example, at least one of a push panel lever arm and a pull panel lever arm can be received in part in the elongated opening. For example, consider an extension of a lever arm that can be received in the elongated opening where the extension may be an axle, a bushing, etc. In such an example, contact (e.g., engagement) can exist or occur at a contact point (e.g., an end of the elongated opening) via pushing of a push panel that can drive the bar linkage in one direction with maintained contact at the contact point where further movement in that direction can occur via pulling of a pull panel that includes a lever arm connected to the bar linkage where the portion of a lever arm of the push panel may become distant from the contact point (e.g., disengaged from the contact point).

As an example, an assembly can include a spring element operatively coupled to a pull panel. For example, consider a spring element that is operatively coupled to a pull panel lever arm of the pull panel. As an example, an assembly can include a spring element that applies an outward bias force to a push panel. As an example, an assembly can include a plurality of springs. In such an example, a push panel may be biased by at least two of the plurality of springs and/or a pull panel may be biased by at least two of the plurality of springs.

As an example, a push panel mating edge can contact a pull panel mating edge for substantially flush alignment of an outer push panel surface and an outer pull panel surface.

As an example, an assembly can include a lock. In such an example, a pull panel can include a lock opening that exposes a keyway of the lock. As an example, a lock can include a lock latch where a pull panel includes a lock latch keeper, where engagement of the lock latch and the lock latch keeper limits rotation of the pull panel. In such an example, engagement of the lock latch and the lock latch keeper can limit rotation of a push panel.

As an example, a linkage can include an elongated opening that receives a portion of a push panel lever arm that contacts an end of the elongated opening where engagement of a lock latch of a lock and a lock latch keeper of a pull panel immovably maintains contact between the portion of the push panel lever arm and the end of the elongated opening. In such an example, the linkage may be spring-biased.

As an example, an assembly can include a lock, where a pull panel includes a lock opening that exposes a keyway of the lock, where the lock includes a lock latch and where the pull panel includes a lock latch keeper, where engagement of the lock latch and the lock latch keeper limits rotation of the push panel. In such an example, engagement of the lock latch and the lock latch keeper can limit rotation of the push panel via a linkage.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. An assembly comprising:
   a chassis that comprises a chamber and an opening;
   a cover movable for access to the chamber via the opening;
   a cover latch; and
   a cover latch release that comprises a push panel operatively coupled via a linkage to a pull panel that comprises a finger grip surface, wherein the linkage rotates the pull panel responsive to rotation of the push panel to expose the finger grip surface, and wherein further rotation of the pull panel releases the cover latch.

2. The assembly of claim 1, wherein the chassis comprises at least one processor and memory accessible to at least one of the at least one processor.

3. The assembly of claim 1, wherein the linkage operatively couples a push panel lever arm and a pull panel lever arm.

4. The assembly of claim 3, comprising a push panel axle and a pull panel axle, wherein movement of the push panel lever arm rotates the push panel about the push panel axle and wherein movement of the pull panel lever arm rotates the pull panel about the pull panel axis.

5. The assembly of claim 1, wherein the linkage comprises a bar linkage.

6. The assembly of claim 5, wherein the bar linkage comprises an elongated opening.

7. The assembly of claim 6, wherein at least one of a push panel lever arm and a pull panel lever arm is received in part in the elongated opening.

8. The assembly of claim 1, comprising a spring element operatively coupled to the pull panel.

9. The assembly of claim 8, wherein the spring element is operatively coupled to a pull panel lever arm of the pull panel.

10. The assembly of claim 1, comprising a spring element that applies an outward bias force to the push panel.

11. The assembly of claim 1, comprising a plurality of springs.

12. The assembly of claim 11, wherein the push panel is biased by at least two of the plurality of springs.

13. The assembly of claim 1, wherein a push panel mating edge contacts a pull panel mating edge for substantially flush alignment of an outer push panel surface and an outer pull panel surface.

14. The assembly of claim 1, comprising a lock.

15. The assembly of claim 14, wherein the pull panel comprises a lock opening that exposes a keyway of the lock.

16. The assembly of claim 14, wherein the lock comprises a lock latch and wherein the pull panel comprises a lock latch keeper, wherein engagement of the lock latch and the lock latch keeper limits rotation of the pull panel.

17. The assembly of claim 16, wherein engagement of the lock latch and the lock latch keeper limits rotation of the push panel.

18. The assembly of claim 1, wherein the linkage comprises an elongated opening that receives a portion of a push panel lever arm that contacts an end of the elongated opening and wherein engagement of a lock latch of a lock and a lock latch keeper of the pull panel immovably maintains contact between the portion of the push panel lever arm and the end of the elongated opening.

19. The assembly of claim 1, comprising a lock, wherein the pull panel comprises a lock opening that exposes a keyway of the lock, wherein the lock comprises a lock latch and wherein the pull panel comprises a lock latch keeper, wherein engagement of the lock latch and the lock latch keeper limits rotation of the push panel.

20. The assembly of claim 19, wherein engagement of the lock latch and the lock latch keeper limits rotation of the push panel via the linkage.

* * * * *